(12) United States Patent
Kanamitsu

(10) Patent No.: US 6,740,456 B2
(45) Date of Patent: May 25, 2004

(54) METHOD OF CORRECTING A PHOTOMASK AND METHOD OF MANUFACTURING A SEMICONDUCTOR DEVICE

(75) Inventor: Shingo Kanamitsu, Kawasaki (JP)

(73) Assignees: Kabushiki Kaisha Toshiba, Tokyo (JP); Dai Nippon Printing Co., Ltd., Tokyo (JP)

( * ) Notice: Subject to any disclaimer, the term of this patent is extended or adjusted under 35 U.S.C. 154(b) by 143 days.

(21) Appl. No.: 10/061,327

(22) Filed: Feb. 4, 2002

(65) Prior Publication Data

US 2002/0122992 A1 Sep. 5, 2002

(30) Foreign Application Priority Data

Feb. 5, 2001 (JP) ........................................ 2001-028553

(51) Int. Cl.[7] ................................................. G03F 9/00
(52) U.S. Cl. ......................................................... 430/5
(58) Field of Search ............................ 430/5, 322, 323, 430/324; 204/192.34

(56) References Cited

U.S. PATENT DOCUMENTS 5,514,498 A * 5/1996 Nakagawa ....................... 430/5
5,696,587 A 12/1997 Yung ........................... 356/375

FOREIGN PATENT DOCUMENTS

| JP | 62-174765 | 7/1987 |
| JP | 63-305358 | 12/1988 |
| JP | 5-4660 | 1/1993 |

* cited by examiner

Primary Examiner—S. Rosasco
(74) Attorney, Agent, or Firm—Finnegan, Henderson, Farabow, Garrett & Dunner, L.L.P.

(57) ABSTRACT

A method of correcting a photomask, comprises preparing a photomask substrate with a mask pattern including a phase shift pattern, forming a reference hole by removing a part of the mask pattern, applying an ion beam from an ion beam source to an area including the reference hole to allow secondary charged particles to be released from the reference hole, obtaining a position of the reference hole by detecting the secondary charged particles by a detector, calculating a positional relationship between the obtained position of the reference hole and a position of a defect of the mask pattern, and correcting the defect by applying an ion beam from the ion beam source to the defect, based on the calculated positional relationship, wherein a pattern of the reference hole, as viewed in a direction perpendicular to a top surface of the photomask substrate, is substantially rectangular, and a longitudinal direction of the rectangular pattern is parallel to a longitudinal direction of the phase shift pattern.

16 Claims, 6 Drawing Sheets

METHOD OF CORRECTING A PHOTOMASK AND METHOD OF MANUFACTURING A SEMICONDUCTOR DEVICE

CROSS-REFERENCE TO RELATED APPLICATIONS

This application is based upon and claims the benefit of priority from the prior Japanese Patent Application No. 2001-028553, filed Feb. 5, 2001, the entire contents of which are incorporated herein by reference.

BACKGROUND OF THE INVENTION

1. Field of the Invention

The present invention relates generally to a method of correcting a photomask used for the manufacture of a semiconductor integrated circuit, and more particularly to a method of correcting a photomask by applying a focused ion beam (FIB) to a defect of the photomask to repair the defect.

2. Description of the Related Art

In correcting a defect of a photomask using a focused ion beam, one point drift correction is used in order to totally correct a drift of an image due to charge up, or a drift due to thermal expansion of a mask or a mask holder. In the one point drift correction, a pinhole is formed in a pattern of the photomask. The beam is moved to the portion to be corrected by using the pinhole as a reference point, thereby enhancing correction accuracy. A specific example of the one point drift correction will be described below with reference to FIGS. 8 to 10.

A focused ion beam 22a is applied to a part of a pattern 12 which is formed on a substrate 11 for a photomask, so that a pinhole 13, which serves as a reference point, is formed. Then, an ion beam 22b is applied from an ion beam source 21 to a scan region 14 including the pinhole 13. Secondary ions (secondary charged particles) 23 released from the portion where the pinhole 13 is formed are detected by a detector 24, thereby recognizing (obtaining) the reference point. Then, the positional relationship between the detected position of the pinhole 13 (position of the reference point) and the portion to be corrected which is known in advance, is calculated. After re-confirming the position of the pinhole 13, the ion beam is applied to the portion to be corrected, thereby correcting the defect. After that, by repeatedly performing the ion beam irradiation for confirming the reference point and the ion beam irradiation for correcting the defect, the defect correction is completed. In this way, by confirming the reference point immediately before the defect correction processing, the influence of a drift can be reduced to a minimum.

If defect correction is performed using the above-described one point drift correction, it is conventionally considered that a round shape is ideal as the shape of a planar pattern of the reference point (pinhole) (refer, for example, to Jpn. Pat. Appln. KOKOKU Publication No. 5-4660). From this point of view, the pinhole is conventionally formed by applying the ion beam to a square-shaped area with an equal number of dots in longitudinal and horizontal directions (e.g. 4×4 dots).

However, if a phase shift mask is used as a photomask, a proper phase shift operation (phase effect) cannot be obtained at the region where the pinhole is formed. Therefore, if the pinhole is large relative to the pattern, a region which affects a projected image is also large. If the pinhole is large, the scan region for detecting the pinhole needs to be large. Thus, the beam scan damages a wide area of the pattern. Therefore, if the pattern is small, the line size of the projected image is small, which is a problem. Further, in the case of correcting a pinhole mark, since a carbon film deposited for correction does not have a phase shift operation, the smaller the pattern, the wider the region which affects the projected image.

As shown in FIG. 10, in general, a detector 24 is disposed obliquely above the pinhole 13. Thus, if the pattern of the pinhole has a square shape, the following problem will arise. Since the detector 24 is disposed obliquely above the pinhole 13, the secondary ions 23 coming out of the pinhole 13 are considered to be blocked to some extent by a sidewall at the detector 24 side (the left sidewall in FIG. 10). Therefore, the length of the pinhole 13 in the X direction shown in FIG. 10 needs to be increased to a degree. In this case, if the pinhole 13 is a square pattern, the length of the pinhole 13 in the Y direction is equal to that in X direction. Regarding the X direction, the arrival of the secondary ions to the detector 24 is limited by the left sidewall (in FIG. 10). Thus, the yield of the secondary ions is biased to the right region (in FIG. 10), and a certain degree of positional accuracy can be obtained. However, since such a situation will hardly occur in the Y direction, the positional accuracy (recognition accuracy) of the pinhole in the Y direction cannot sufficiently be obtained. In actuality, as shown in FIG. 11, a secondary ion image 31 corresponding to the pinhole is a vertically elongated image in the Y direction.

Further, in the prior art, many secondary ions are blocked by a sidewall on the detector 24 side as described above. Thus, there is a problem that the secondary ions from the bottom portion of the pinhole, i.e., the exposed surface of the substrate, do not reach the detector with efficiency.

In the conventional method of correcting the photomask using one point drift correction, if the phase shift mask is used as a photomask, the region, where phase shift operation (phase effect) cannot be obtained, increases. Thus, a proper projected image cannot be obtained, which is a problem. There are also problems that the positional accuracy (recognition accuracy) of the reference pinhole is insufficient, and that the secondary ions (secondary charged particles) from the pinhole cannot efficiently be made incident on the detector.

BRIEF SUMMARY OF THE INVENTION

According to a first aspect of the present invention, there is provided a method of correcting a photomask, comprising: preparing a photomask substrate with a mask pattern including a phase shift pattern; forming a reference hole by removing a part of the mask pattern; applying an ion beam from an ion beam source to an area including the reference hole to allow secondary charged particles to be released from the reference hole; obtaining a position of the reference hole by detecting the secondary charged particles by a detector; calculating a positional relationship between the obtained position of the reference hole and a position of a defect of the mask pattern; and correcting the defect by applying an ion beam from the ion beam source to the defect, based on the calculated positional relationship, wherein a pattern of the reference hole, as viewed in a direction perpendicular to a top surface of the photomask substrate, is substantially rectangular, and a longitudinal direction of the rectangular pattern is parallel to a longitudinal direction of the phase shift pattern.

According to a second aspect of the present invention, there is provided a method of correcting a photomask, comprising: preparing a photomask substrate having a mask pattern; forming a reference hole by removing a part of the mask pattern; applying an ion beam from an ion beam source to an area including the reference hole to allow secondary charged particles to be released from the reference hole; obtaining a position of the reference hole by detecting the secondary charged particles by a detector, a charged particle incidence portion of the detector being disposed obliquely above the reference hole; calculating a positional relationship between the obtained position of the reference hole and a position of a defect of the mask pattern; and correcting the defect by applying an ion beam from the ion beam source to the defect, based on the calculated positional relationship, wherein a pattern of the reference hole, as viewed in a direction perpendicular to a top surface of the photomask substrate, is substantially rectangular, and a longitudinal direction of the rectangular pattern is parallel to a straight line obtained by projecting, on the top surface of the photomask substrate, a straight line linking the incidence portion of the detector and the reference hole.

According to a third aspect of the present invention, there is provided a method of correcting a photomask, comprising: preparing a photomask substrate having a mask pattern; forming a reference hole by removing a part of the mask pattern; applying an ion beam from an ion beam source to an area including the reference hole to allow secondary charged particles to be released from the reference hole; obtaining a position of the reference hole by detecting the secondary charged particles by a detector, a charged particle incidence portion of the detector being disposed obliquely above the reference hole; calculating a positional relationship between the obtained position of the reference hole and a position of a defect of the mask pattern; and correcting the defect by applying an ion beam from the ion beam source to the defect, based on the calculated positional relationship, wherein the reference hole is defined by a first sidewall located at the same side as the incidence portion of the detector, and a second sidewall opposed to the first sidewall, and an inclination of a plane linking a bottom end and an upper end of the first sidewall is more gentle than that of a plane linking a bottom end and an upper end of the second side wall.

DETAILED DESCRIPTION OF THE INVENTION

A method of correcting a photomask using one point drift correction according to the embodiment of the present invention will now be described below with reference to the drawings.

Figure 1:
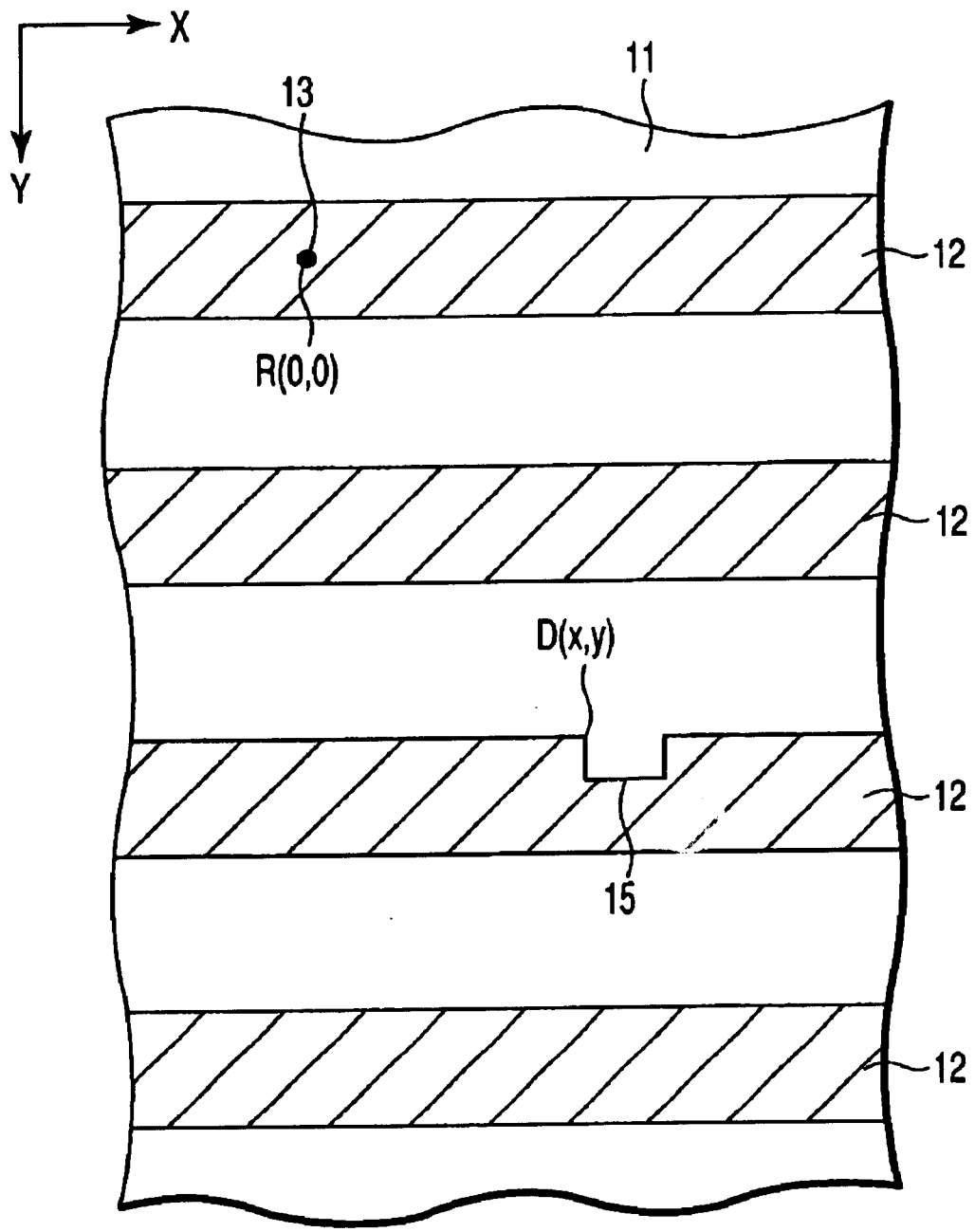
FIG. 1 is a plan view showing one example of a photomask according to an embodiment of the present invention.
Figure 2:
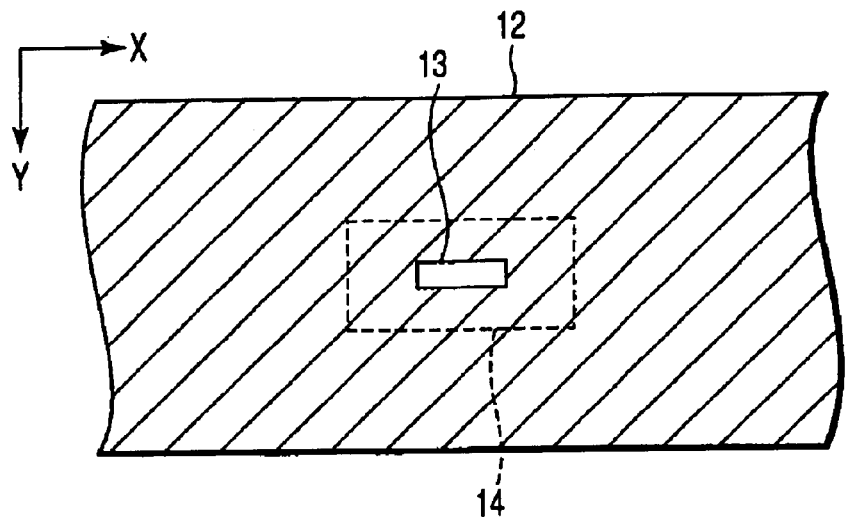
FIG. 2 is a plan view showing the vicinity of a pinhole shown in FIG. 1.
Figure 3A:
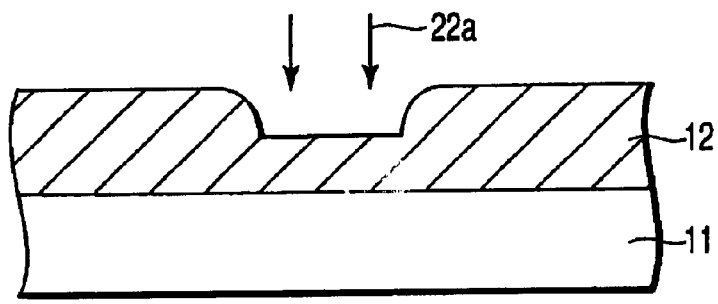
FIGS. 3A and 3B are cross-sectional views illustrating a method of forming the pinhole shown in FIG. 1.
Figure 3B:
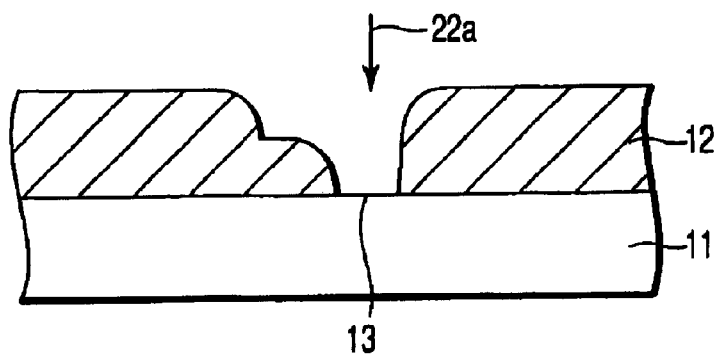
Figure 4:
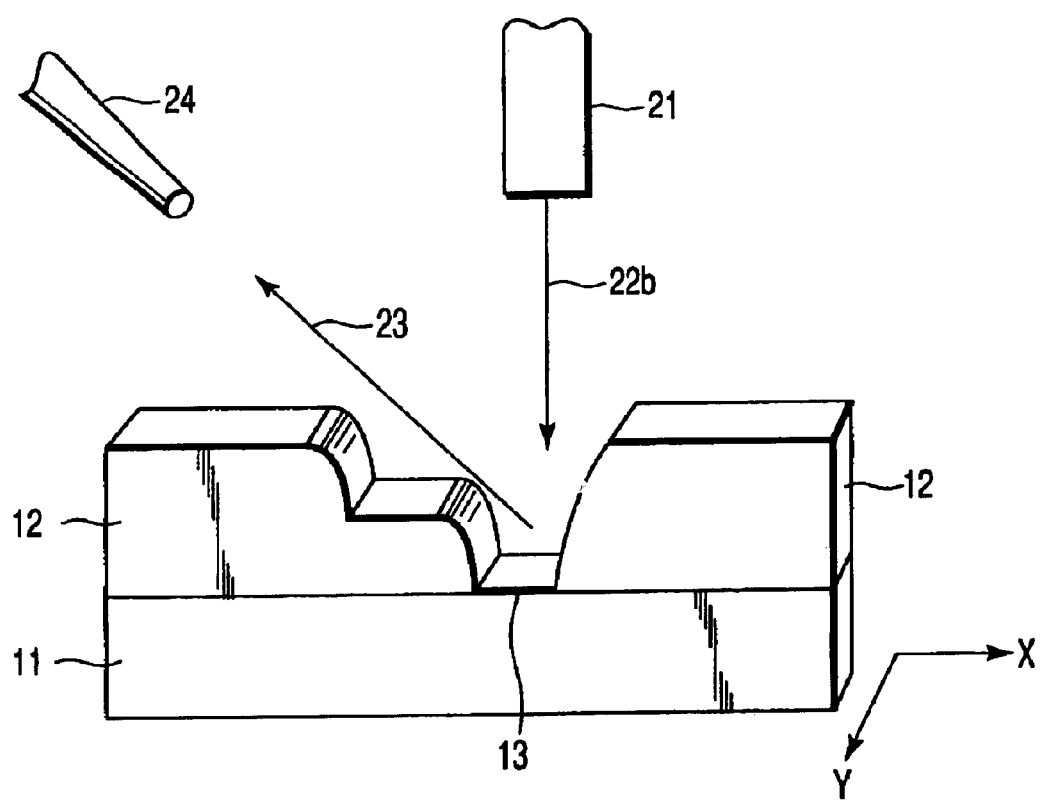
FIG. 4 shows a method of detecting the pinhole shown in FIG. 1.
Figure 5:
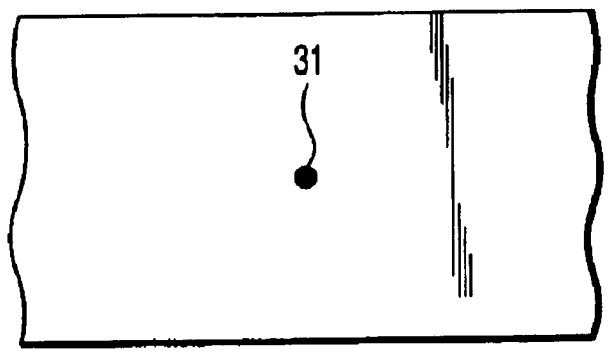
FIG. 5 shows a secondary ion image obtained by the method according to the embodiment of the present invention.
Figure 6:
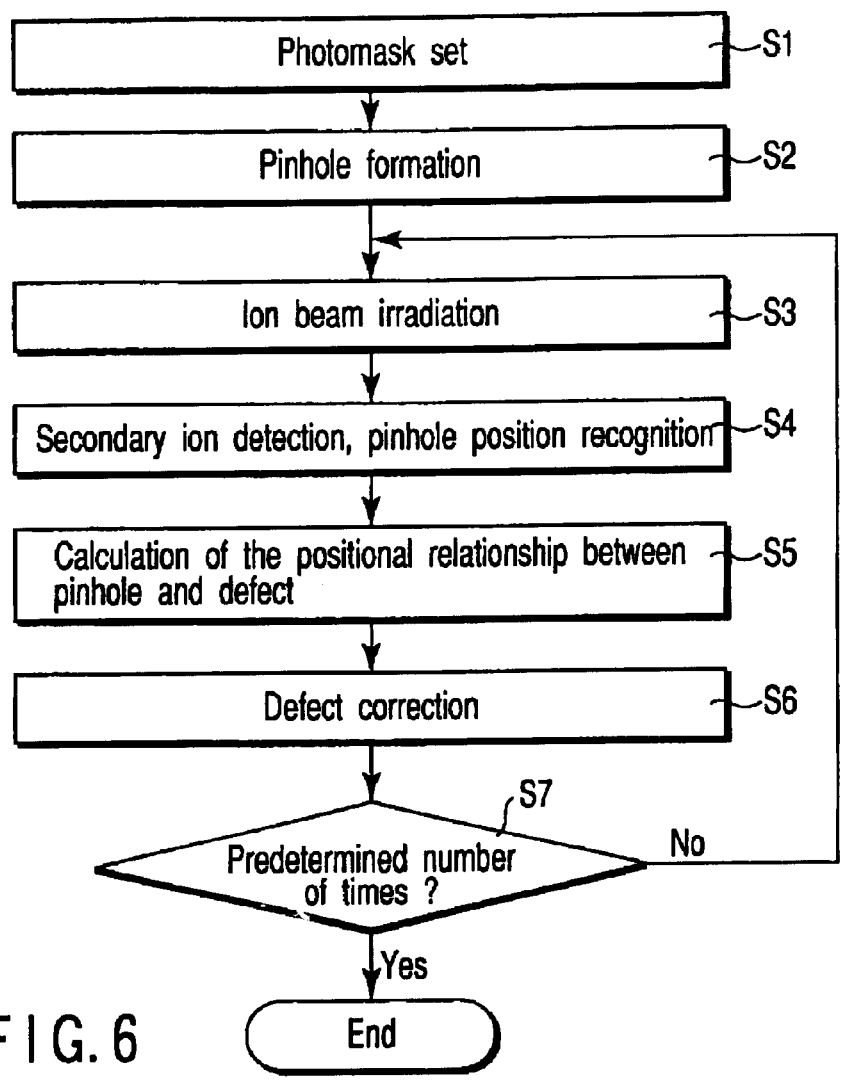
FIG. 6 is a flow chart illustrating a method of correcting the photomask according to the embodiment of the present invention.

FIG. 1 is a plan view showing one example of a photomask according to the embodiment of the present invention; FIG. 2 is a plan view showing the vicinity of a reference pinhole shown in FIG. 1; FIGS. 3A and 3B are cross-sectional views (cross-sectional views in the X direction of FIG. 2) illustrating a method of forming the pinhole shown in FIG. 1; FIG. 4 shows a method of detecting the pinhole shown in FIG. 1; FIG. 5 shows a secondary ion image obtained by the method according to the embodiment of the present invention; and FIG. 6 is a flow chart illustrating a method according to the embodiment of the present invention.

To start with, a phase shift mask such as a half tone phase shift mask or an embedded phase shift mask is prepared as a photomask, and is set in a correcting apparatus (step S1). The phase shift mask comprises a quartz substrate 11, and a phase shift pattern 12 (pattern for causing a phase effect) of a MoSi film, formed on the substrate 11.

After the photomask is set, a focused ion beam is applied from an emission portion of an ion beam source onto the substrate 11 to form a pinhole 13, which serves as a reference point, in the pattern 12 (step S2).

As shown in FIG. 2, the planar pattern of the pinhole 13 is substantially rectangular, and the longitudinal direction (X direction) of the phase shift pattern 12 and that of the pattern of the pinhole 13 are substantially parallel. For example, the ion beam is applied in a rectangular shape with 4 dots in the X direction and 1 dot in the Y direction.

The pinhole 13 is formed in two separate stages, as shown in FIGS. 3A and 3B. First, as shown in FIG. 3A, about half the film for forming the pattern 12 is removed, in the direction of film thickness, by the focused ion beam 22a. After that, as shown in FIG. 3B, the area to which the beam is applied is narrowed in the X direction, and a right-hand region of the pinhole 13 (in FIG. 3B) is selectively removed, thereby exposing the surface of the substrate 11. As a result, the sidewall of the pinhole 13 at the left side is recessed stepwise, from the bottom end of the sidewall towards the upper end. The inclination of the plane linking the bottom end and upper end of the left-hand sidewall (in FIG. 3B) is more gentle than that of the plane linking the bottom end and upper end of the right-hand sidewall. In the embodiment shown in FIGS. 3A and 3B, the sidewall is recessed in two stages, however, it may be recessed in three stages or more. The sidewall may also be recessed successively.

After the pinhole 13 is formed as above, the ion beam is applied to a scan region 14 (see FIG. 2) including the pinhole 13, and the position of the pinhole 13, which serves as a reference point, is detected (recognized or obtained) (steps S3, S4). Specifically, as shown in FIG. 4, an ion beam 22b is applied from the ion beam source 21 used for the pinhole formation, to the bottom surface of the pinhole 13, i.e., the exposed surface of the substrate 11. Secondary ions (secondary silicon ions) 23 released from the bottom surface of the pinhole 13 is detected by the detector 24 disposed obliquely above the pinhole 13. The distal end of the detector 24 is cylindrical. If the straight line linking the distal end portion (secondary ion incidence portion) of the detector 24 and the pinhole 13 (beam irradiated portion) is projected on the surface of the substrate 11, the projected straight line is parallel to the longitudinal direction of the rectangular pattern of the pinhole 13. In other words, the substrate 11 having the phase shift pattern 12 formed is preset within the apparatus such that the parallel relationship as above can be obtained.

A secondary ion image 31 obtained by the detector 24 is dot-shaped, as shown in FIG. 5. Based on the position of the pinhole 13 determined by the secondary ion image 31 and the position of a correction portion (defective portion) 15 determined in advance (see FIG. 1), the positional relationship between the pinhole 13 and the correction portion 15 is calculated in a control apparatus (not shown) (step S5). For example, as shown in FIG. 1, if the position of the pinhole 13 is regarded as R(0,0), the position D(x,y) of the correction portion 15 can be determined.

Next, the position to which the ion beam from the ion beam source 21 is applied is returned to the position of the pinhole 13. After that, based on the positional relationship determined as described above, the position to which the ion beam is applied is moved to the position of the correction portion 15. Further, the ion beam is applied from the ion beam source 21 to the correction portion 15, thereby performing defect correction of the correction portion 15 (step S6). If the defect of the correction portion 15 is a pattern loss as shown in FIG. 1, correction is performed by depositing a carbon film while applying the ion beam to the loss portion. If the defect of the correction portion 15 is a pattern surplus, correction is performed by applying the ion beam to the surplus portion to perform etching.

After that, the required number of repeating steps S3 to S6 is performed (step S7). In this way, correction of the defect is completed. The repair process of the pinhole 13 is performed according to necessity.

Figure 7:
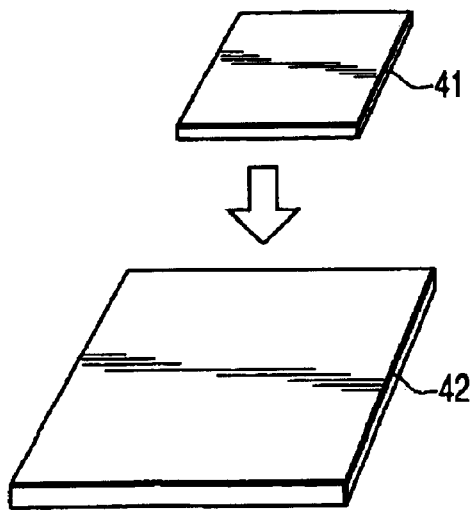
FIG. 7 shows an example in which the photomask according to the embodiment of the present invention is applied to the manufacture of a semiconductor device.
Figure 8:
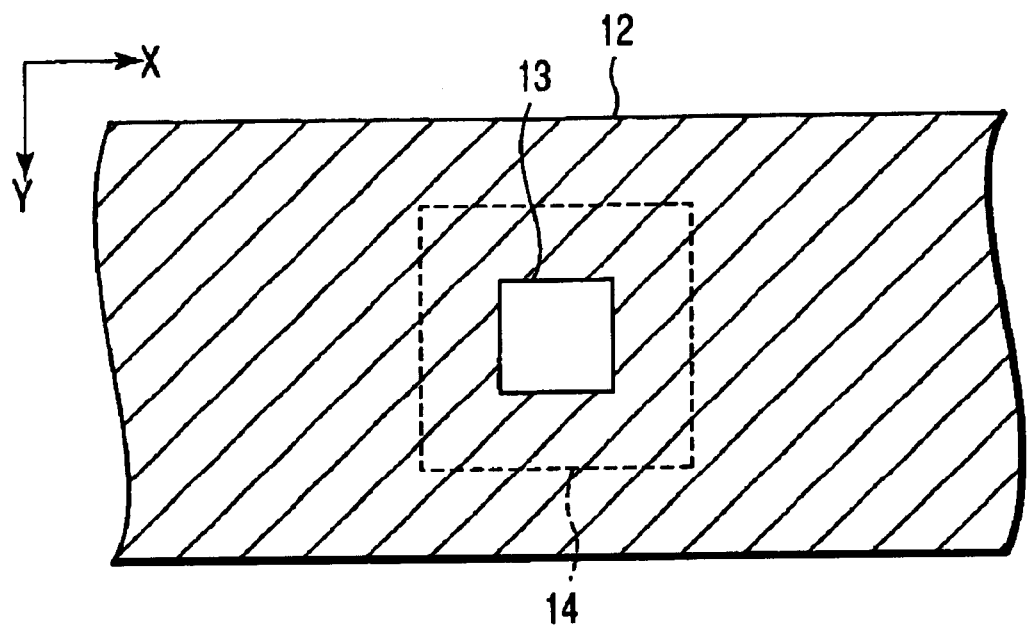
FIG. 8 shows a plan view showing the vicinity of the pinhole in the conventional photomask.
Figure 9:
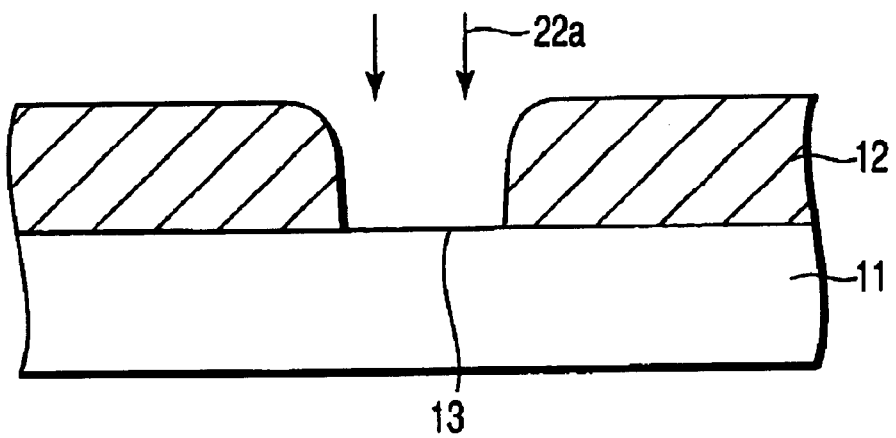
FIG. 9 is a cross-sectional view showing a conventional method of forming a pinhole.
Figure 10:
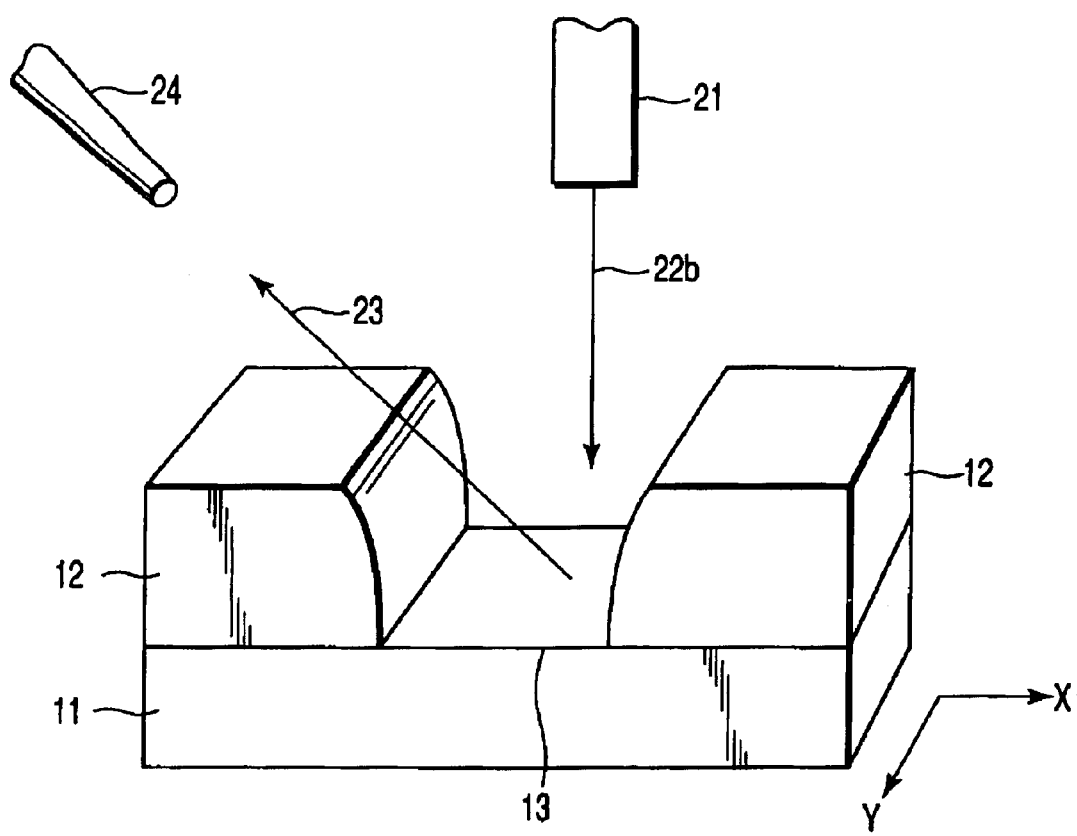
FIG. 10 shows a conventional method of detecting the pinhole.
Figure 11:
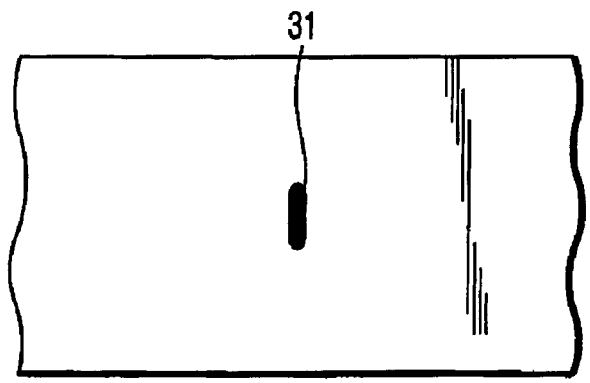
FIG. 11 shows a secondary ion image obtained by the conventional method.

The photomask thus obtained is applied to the manufacture of a semiconductor device (integrated circuit device). Specifically, as shown in FIG. 7, the pattern of a photomask 41 is projected on a photoresist formed on a semiconductor substrate 42, thereby obtaining a fine pattern for forming an integrated circuit.

As described above, according to the embodiment of the present invention, the longitudinal direction of the rectangular pinhole pattern is parallel to the longitudinal direction of the phase shift pattern. Thus, the width of the short edge of the rectangular pattern is narrow. Specifically, the width of the rectangular pattern narrows in the direction that light intensity distribution occurs due to the phase shift operation (phase effect). It is therefore possible to reduce the area that reduces the phase effect. Even if the size (line width) of the phase shift pattern is small, there is no need to correct a pinhole mark. If the pinhole mark is corrected, the area whose phase effect is degraded by the carbon film deposited for correction can be reduced to a minimum. Since the width of the pinhole is narrow, the scan region at the time of detecting the pinhole is also narrow. Thus, damage of the beam scan to the pattern can be suppressed to a minimum. As described above, in the embodiment of the present invention, the influence of the reference pinhole can be suppressed to a minimum, and one point drift correction can be performed effectively.

According to the embodiment of the present invention, the planar pattern of the pinhole is relatively long in the X direction, and relatively short in the Y direction. Thus, a sufficient amount of secondary ions can arrive at the detector. Furthermore, the pinhole position detection accuracy can be improved. That is, in the X direction, a certain extent of position detection accuracy and secondary ion arrival amount can be obtained, as in the prior art. Concerning the Y direction, the position detection accuracy can be considerably improved compared with the prior art, by narrowing the width of the pinhole. The advantages described above can be obtained in the case of an ordinary mask (a so-called binary mask, typically, a chrome mask), which does not use the phase effect, and is not limited to the phase shift mask.

According to the embodiment of the present invention, the sidewall at the detector side is inclined successively or in stages. The average inclination thereof is gentle. Thus, the ratio of the secondary charged particles which are blocked by the sidewall at the detector side can be reduced. Even if the bottom portion of the pinhole, i.e., the exposed portion of the substrate is small, the secondary charged particles can be entered efficiently into the detector. For example, as shown in FIGS. 3A, 3B and FIG. 4, the sidewall of the pinhole 13 at the detector 24 side is inclined. Preferably, the inclination angle of the plane linking the upper end and bottom end of the sidewall is made equal to the inclination angle of the straight line linking the distal end of the detector 24 and the pinhole 13. Thereby, the secondary ions can arrive at the detector with efficiency. Even if the bottom surface of the pinhole 13 is small, the yield reduction of the secondary ion can be suppressed, and damage to the substrate can be reduced. The advantages described above can be obtained in the case of an ordinary mask (a so-called binary mask, typically, a chrome mask), which does not use the phase effect, and is not limited to the phase shift mask.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of correcting a photomask, comprising:
   preparing a photomask substrate with a mask pattern including a phase shift pattern;
   forming a reference hole by removing a part of the mask pattern;
   applying an ion beam from an ion beam source to an area including the reference hole to allow secondary charged particles to be released from the reference hole;
   obtaining a position of the reference hole by detecting the secondary charged particles by a detector;
   calculating a positional relationship between the obtained position of the reference hole and a position of a defect of the mask pattern; and
   correcting the defect by applying an ion beam from the ion beam source to the defect, based on the calculated positional relationship,
   wherein a pattern of the reference hole, as viewed in a direction perpendicular to a top surface of the photomask substrate, is substantially rectangular, and a longitudinal direction of the rectangular pattern is parallel to a longitudinal direction of the phase shift pattern.

2. A method according to claim 1, wherein a charged particle incidence portion of the detector is disposed obliquely above the reference hole, and the longitudinal direction of the rectangular pattern is parallel to a straight line obtained by projecting, on the top surface of the photomask substrate, a straight line linking the incidence portion of the detector and the reference hole.

3. A method according to claim 2, wherein the reference hole is defined by a first sidewall located at the same side as the incidence portion of the detector, and a second sidewall opposed to the first sidewall, and an inclination of a plane linking a bottom end and an upper end of the first sidewall is more gentle than that of a plane linking a bottom end and an upper end of the second sidewall.

4. A method according to claim 1, wherein a charged particle incidence portion of the detector is disposed obliquely above the reference hole, the reference hole is defined by a first sidewall located at the same side as the incidence portion of the detector, and a second sidewall opposed to the first sidewall, and an inclination of a plane linking a bottom end and an upper end of the first sidewall is more gentle than that of a plane linking a bottom end and an upper end of the second sidewall.

5. A method according to claim 1, wherein the reference hole is formed by applying an ion beam from the ion beam source.

6. A method according to claim 1, wherein a series of processes from applying the ion beam to the area including the reference hole to correcting the defect is performed a plurality of times.

7. A method of manufacturing a semiconductor device comprising projecting a pattern on a semiconductor substrate using the photomask corrected by the method according to claim 1.

8. A method of correcting a photomask, comprising:

preparing a photomask substrate having a mask pattern;

forming a reference hole by removing a part of the mask pattern;

applying an ion beam from an ion beam source to an area including the reference hole to allow secondary charged particles to be released from the reference hole;

obtaining a position of the reference hole by detecting the secondary charged particles by a detector, a charged particle incidence portion of the detector being disposed obliquely above the reference hole;

calculating a positional relationship between the obtained position of the reference hole and a position of a defect of the mask pattern; and correcting the defect by applying an ion beam from the ion beam source to the defect, based on the calculated positional relationship, wherein a pattern of the reference hole, as viewed in a direction perpendicular to a top surface of the photomask substrate, is substantially rectangular, and a longitudinal direction of the rectangular pattern is parallel to a straight line obtained by projecting, on the top surface of the photomask substrate, a straight line linking the incidence portion of the detector and the reference hole.

9. A method according to claim 8, wherein the reference hole is defined by a first sidewall located at the same side as the incidence portion of the detector, and a second sidewall opposed to the first sidewall, and an inclination of a plane linking a bottom end and an upper end of the first sidewall is more gentle than that of a plane linking a bottom end and an upper end of the second sidewall.

10. A method according to claim 8, wherein the reference hole is formed by applying an ion beam from the ion beam source.

11. A method according to claim 8, wherein a series of processes from applying the ion beam to the area including the reference hole to correcting the defect is performed a plurality of times.

12. A method of manufacturing a semiconductor device comprising projecting a pattern on a semiconductor substrate using the photomask corrected by the method according to claim 8.

13. A method of correcting a photomask, comprising:

preparing a photomask substrate having a mask pattern;

forming a reference hole by removing a part of the mask pattern;

applying an ion beam from an ion beam source to an area including the reference hole to allow secondary charged particles to be released from the reference hole;

obtaining a position of the reference hole by detecting the secondary charged particles by a detector, a charged particle incidence portion of the detector being disposed obliquely above the reference hole;

calculating a positional relationship between the obtained position of the reference hole and a position of a defect of the mask pattern; and correcting the defect by applying an ion beam from the ion beam source to the defect, based on the calculated positional relationship, wherein the reference hole is defined by a first sidewall located at the same side as the incidence portion of the detector, and a second sidewall opposed to the first sidewall, and an inclination of a plane linking a bottom end and an upper end of the first sidewall is more gentle than that of a plane linking a bottom end and an upper end of the second side wall.

14. A method according to claim 13, wherein the reference hole is formed by applying an ion beam from the ion beam source.

15. A method according to claim 13, wherein a series of processes from applying the ion beam to the area including the reference hole to correcting the defect is performed a plurality of times.

16. A method of manufacturing a semiconductor device comprising projecting a pattern on a semiconductor substrate using the photomask corrected by the method according to claim 13.

* * * * *